(12) United States Patent
Liu (10) Patent No.: US 10,319,845 B2
(45) Date of Patent: Jun. 11, 2019

(54) INSULATED GATE BIPOLAR TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jian Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 6 days.

(21) Appl. No.: 15/874,125

(22) Filed: Jan. 18, 2018

(65) Prior Publication Data

US 2018/0204938 A1    Jul. 19, 2018

(30) Foreign Application Priority Data

Jan. 18, 2017 (CN) .......................... 2017 1 0038516

(51) Int. Cl.
| | |
|---|---|
| *H01L 29/76* | (2006.01) |
| *H01L 29/739* | (2006.01) |
| *H01L 29/06* | (2006.01) |
| *H01L 29/66* | (2006.01) |

(52) U.S. Cl.
CPC ...... *H01L 29/7397* (2013.01); *H01L 29/0615* (2013.01); *H01L 29/0619* (2013.01); *H01L 29/0646* (2013.01); *H01L 29/0653* (2013.01); *H01L 29/0696* (2013.01); *H01L 29/66348* (2013.01)

(58) Field of Classification Search
None
See application file for complete search history.

(56) References Cited

U.S. PATENT DOCUMENTS

| | | | | |
|---|---|---|---|---|
| 9,209,296 | B2* | 12/2015 | Toyoda | ........... H01L 21/823412 |
| 2008/0079066 | A1* | 4/2008 | Hamaguchi | ......... H01L 29/0696 257/330 |
| 2011/0024834 | A1* | 2/2011 | Hull | .................. H01L 29/42376 257/335 |

(Continued)

*Primary Examiner* — Kevin M Picardat
(74) *Attorney, Agent, or Firm* — Anova Law Group, PLLC (57) ABSTRACT

An insulated gate bipolar transistor and a method for fabricating the insulated gate bipolar transistor are provided. The insulated gate bipolar transistor includes a semiconductor layer including a bulk layer and a cell region including a first region and a second region. The insulated gate bipolar transistor also includes a well region, a drift region, and a plurality of gate structures in the bulk layer associated with the cell region. Further, the insulated gate bipolar transistor includes source and drain doped regions and an ohmic contact region in a top region of the well region. A size of the source and drain doped regions in the second region is smaller than a size of the source and drain doped regions in the first region. A size of the ohmic contact region in the second region is larger than a size of the ohmic contact region in the first region.

20 Claims, 5 Drawing Sheets

(56) References Cited

U.S. PATENT DOCUMENTS

| | | | |
|---|---|---|---|
| 2014/0339600 A1* | 11/2014 | Yoshikawa | H01L 29/36 257/139 |
| 2015/0014743 A1* | 1/2015 | Werber | H01L 23/48 257/140 |
| 2015/0249083 A1* | 9/2015 | Okawara | H01L 27/0635 257/140 |
| 2017/0125407 A1* | 5/2017 | Schulze | H01L 21/823418 |
| 2017/0250269 A1* | 8/2017 | Sumitomo | H01L 29/7397 |

* cited by examiner

INSULATED GATE BIPOLAR TRANSISTOR AND FABRICATION METHOD THEREOF

CROSS-REFERENCES TO RELATED APPLICATIONS

This application claims the priority of Chinese patent application No. 201710038516.9, filed on Jan. 18, 2017, the entirety of which is incorporated herein by reference.

FIELD OF THE DISCLOSURE

The present disclosure generally relates to the field of semiconductor manufacturing and, more particularly, relates to an insulated gate bipolar transistor and fabrication method thereof.

BACKGROUND

An insulated gate bipolar transistor (IGBT) is a composite full-controlled voltage-driven power semiconductor device including a bipolar junction transistor (BJT) and an insulated-gate field-effect transistor. The insulated gate bipolar transistor has advantages of both high input impedance and low conduction voltage drop. Therefore, the insulated gate bipolar transistor, an important switching device, has been widely used in a variety of switching circuit structures. For example, the insulated gate bipolar transistor has been used in frequency converter, inverter, and other circuit structures.

However, the electrical performance of the conventional insulated gate bipolar transistor still needs to be improved. The disclosed device structures and methods are directed to solve one or more problems set forth above and other problems.

BRIEF SUMMARY OF THE DISCLOSURE

One aspect of the present disclosure includes an insulated gate bipolar transistor. The insulated gate bipolar transistor includes a semiconductor layer including a collector electrode layer and a bulk layer on the collector electrode layer. The semiconductor layer has a cell region and an edge region around the cell region, and the cell region includes a first region and a second region around the first region. The insulated gate bipolar transistor also includes a well region, a drift region, and a plurality of gate structures in the bulk layer associated with the cell region. The drift region is formed between the well region and the collector electrode layer, and a conductivity type of the drift region is respectively opposite to conductivity types of the well region and the collector electrode layer. Each gate structure penetrates through the well region and extends into the drift region. In addition, the insulated gate bipolar transistor includes source and drain doped regions in a top region of the well region on both sides of each gate structure. A conductivity type of the source and drain doped regions is opposite to the conductivity type of the well region, and a size of the source and drain doped regions in the second region is smaller than a size of the source and drain doped regions in the first region. Further, the insulated gate bipolar transistor includes an ohmic contact region in the top region of the well region. The source and drain doped regions are formed between each gate structure and the ohmic contact region, and a conductivity type of the ohmic contact region is the same as the conductivity type of the well region. A size of the ohmic contact region in the second region is larger than a size of the ohmic contact region in the first region.

Another aspect of the present disclosure includes a method for fabricating an insulated gate bipolar transistor. The method includes providing a semiconductor layer, including a collector electrode layer and a bulk layer on the collector electrode layer. The semiconductor layer has a cell region and an edge region around the cell region, and the cell region includes a first region and a second region around the first region. The method also includes forming a well region, a drift region, and a plurality of gate structures, in the bulk layer associated with the cell region. The drift region is formed between the well region and the collector electrode layer, and a conductivity type of the drift region is respectively opposite to conductivity types of the well region and the collector electrode layer. Each gate structure penetrates through the well region and extends into the drift region. Further, the method includes forming source and drain doped regions and an ohmic contact region in a top region of the well region. The source and drain doped regions are formed on both sides of each gate structure and between the gate structure and the ohmic contact region, and a conductivity type of the source and drain doped regions is opposite to the conductivity type of the well region. A size of the source and drain doped regions in the second region is smaller than a size of the source and drain doped regions in the first region. A conductivity type of the ohmic contact region is the same as the conductivity type of the well region, and a size of the ohmic contact region in the second region is larger than a size of the ohmic contact region in the first region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
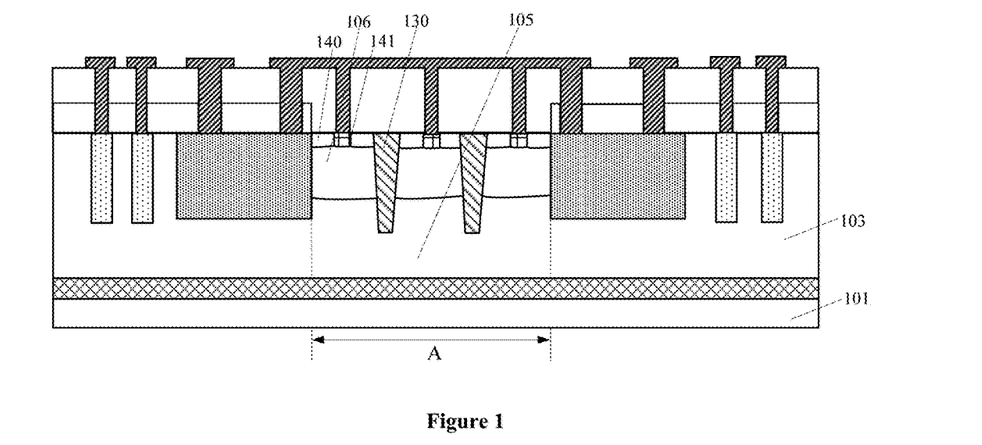
FIG. 1 illustrates an insulated gate bipolar transistor.

FIG. 1 illustrates an insulated gate bipolar transistor. Referring to FIG. 1, the insulated gate bipolar transistor includes a semiconductor layer. The semiconductor layer includes a collector electrode layer 101 and a bulk layer 103 on the collector electrode layer 101. The semiconductor layer also includes a cell region 'A' and an edge region around the cell region 'A'. The insulated gate bipolar transistor also includes a well region 106 in a top region of the bulk layer 103 in the cell region 'A' and a plurality of gate structures 130 in the bulk layer 103 in the cell region 'A'. Each gate structure 130 penetrates through the well region 106 and extends into the bulk layer 103 between the well region 106 and the collector electrode layer 101. In addition, the insulated gate bipolar transistor includes a drift region 105 in the bulk layer 103 in the cell region 'A'. The drift region 105 is formed between the gate structure 130 and the collector electrode layer 101, and between the well region 106 on both sides of each gate structure 130 and the collector electrode layer 101. A conductivity type of the drift region 105 is respectively opposite to conductivity types of the well region 106 and the collector electrode layer 101. Moreover, the insulated gate bipolar transistor includes source and drain doped regions 140 in the top region of the well region 106 on both sides of each gate structure 130. A conductivity type of the source and drain doped regions 140 is opposite to the conductivity type of the well region 106. Further, the insulated gate bipolar transistor includes an ohmic contact region 141 in the top region of the well region 106. The source and drain doped regions 140 are formed between each gate structure 130 and the ohmic contact region 141. A conductivity type of the ohmic contact region 141 is the same as the conductivity type of the well region 106.

A conductive plug is subsequently formed on the ohmic contact region 141. The ohmic contact region 141 is capable of reducing a contact barrier between the well region 106 and the conductive plug. However, the electrical performance of the above-described insulated gate bipolar transistor is poor. Reasons for the described issue include the following.

The size of the source and drain doped regions 140 in each region of the cell region 'A' is equal, and the size of the ohmic contact region 141 in each region of the cell region 'A' is equal. The ohmic contact region 141 is formed by doping portions of the well region 106 with ohmic contact ions. The well region 106 has well ions. A conductivity type of the ohmic contact ion is the same as a conductivity type of the well ion. A total concentration of ions in the ohmic contact region 141 is larger than a concentration of the well ions in the well region 106. A channel region is formed in the well region 106 near the gate structure 130. A concentration of ions in the channel region affects a threshold voltage of the gate structure. When forming the ohmic contact region 141, the ohmic contact ions in the ohmic contact region 141 easily diffuse into the channel region below the source and drain doped regions 140, and thus, the threshold voltage of the gate structure 130 increases. Therefore, to ensure that the overall threshold voltage of the insulated gate bipolar transistor is small to reduce the effective power consumption, the effect of the concentration of ions in the ohmic contact region 141 on the concentration of ions in the channel region below the source and drain doped regions 140 needs to be reduced in a process design.

Therefore, in the process design, the size of the source and drain doped regions 140 in each region of the cell region 'A' is large. Accordingly, the size of the ohmic contact region 141 in each region of the cell region 'A' is small.

In addition, the source and drain doped regions 140, the well region 106 between the source and drain doped regions 140 and the drift region 105, and the drift region 105 forms a triode. The well region 106 between the source and drain doped regions 140 and the drift region 105 serves as a base of the triode. Because the size of the source and drain doped regions 140 is large and the size of the ohmic contact region 141 is small, a resistance of the well region 106 between the source and drain doped regions 140 and the drift region 105 as the base of the triode is large. For example, on the one hand, the size of the source and drain doped regions 140 is large, and thus, a resistance length of the well region 106 between the source and drain doped regions 140 and the drift region 105 as the base of the triode is large. On the other hand, the size of the ohmic contact region 141 is small, and thus, a distance from an edge of the ohmic contact region 141 to the gate structure 130 is large. The ohmic contact ions in the ohmic contact region 141 are less likely to diffuse into the well region 106 between the source and drain doped regions 140 and the drift region 105. Accordingly, the resistance of the well region 106 between the source and drain doped regions 140 and the drift region 105 as the base of the triode is large.

When turning off the insulated gate bipolar transistor, a hole current flowing from the collector electrode layer 101 to the drift region 105 and the well region 106 flows through the base of the triode having a large resistance, and a voltage applied between the source and drain doped regions 140 and the well region 106 as the base of the triode is large. As a result, a PN junction between the source and drain doped regions 140 and the well region 106 as the base of the triode is likely to be opened, thereby the ability of anti-latching effect of the insulated gate bipolar transistor is poor, and the reverse turn off safe operating area of the insulated gate bipolar transistor is small.

Figure 6:
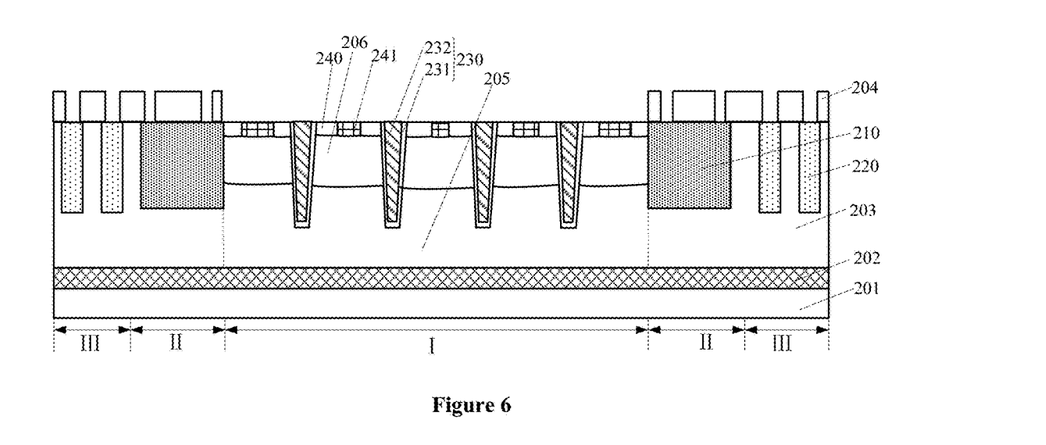
Figure 7:
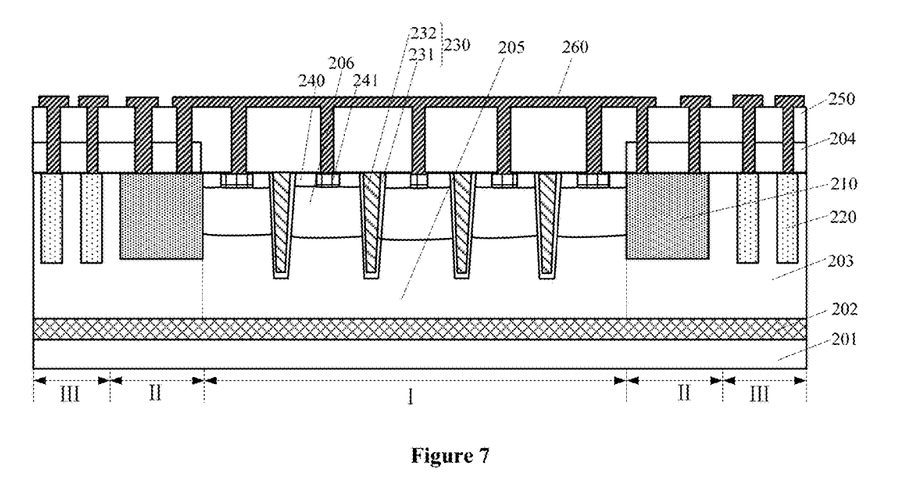
Figure 8:
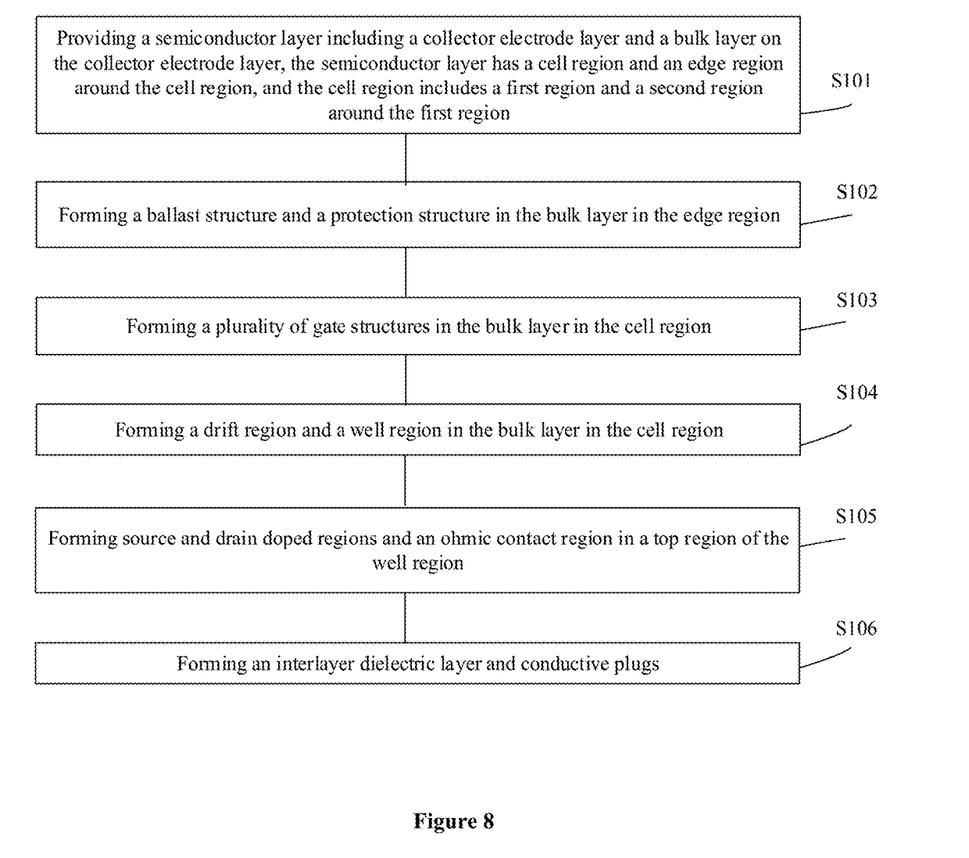
FIG. 8 illustrates an exemplary fabrication method for forming an insulated gate bipolar transistor consistent with various disclosed embodiments of the present disclosure.

The present disclosure provides an insulated gate bipolar transistor and a fabrication method thereof. FIG. 8 illustrates an exemplary fabrication method for forming an insulated gate bipolar transistor consistent with disclosed embodiments; and FIGS. 2-7 illustrate semiconductor structures corresponding to certain stages of the exemplary fabrication method.

Figure 2:
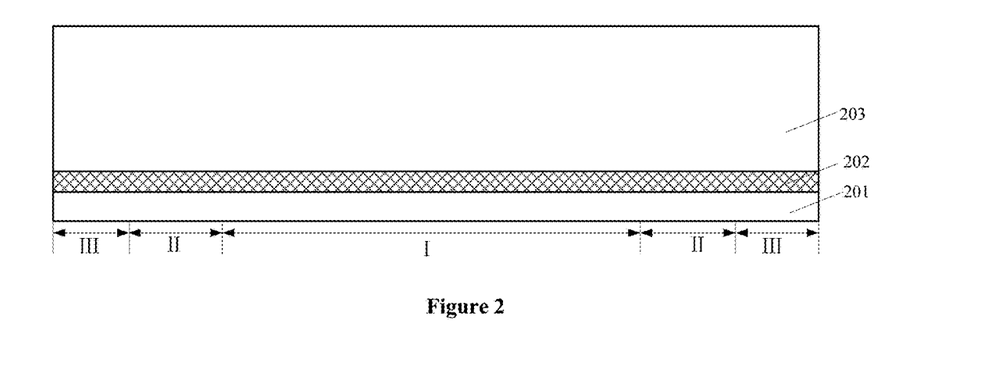
FIGS. 2-7 illustrate semiconductor structures corresponding to certain stages for forming an exemplary insulated gate bipolar transistor consistent with various disclosed embodiments of the present disclosure.

As illustrated in FIG. 8, at the beginning of the fabrication method, a semiconductor layer may be provided (S101). FIG. 2 illustrates a corresponding semiconductor structure.

Referring to FIG. 2, a semiconductor layer may be provided. The semiconductor layer may include a collector electrode layer 201 and a bulk layer 203 on the collector electrode layer 201. The semiconductor layer may also include a cell region I and an edge region around the cell region I. The cell region I may include a first region and a second region around the first region.

In one embodiment, the semiconductor layer may also include a buffer layer 202. The buffer layer 202 may be formed between the collector electrode layer 201 and the bulk layer 203. The buffer layer 202 may prevent the collector electrode layer 201 and a subsequently formed well region from being penetrated, thereby a withstand voltage capability of the insulated gate bipolar transistor along a direction from the bulk layer 203 to the collector electrode layer 201 may be enhanced.

A conductivity type of the collector electrode layer 201 may be opposite to a conductivity type of the buffer layer 202. For example, the conductivity type of a semiconductor material of the collector electrode layer 201 may be opposite to the conductivity type of a semiconductor material of the buffer layer 202.

In one embodiment, the conductivity type of the semiconductor material of the collector electrode layer 201 is P-type, and the conductivity type of the semiconductor material of the buffer layer 202 is N-type as an example. In another embodiment, the conductivity type of the semiconductor material of the collector electrode layer may be N-type, and the conductivity type of the semiconductor material of the buffer layer may be P-type.

In one embodiment, an initial semiconductor layer may be provided. The initial semiconductor layer may have bulk ions. The initial semiconductor layer may include a first face and a second face facing toward each other. The buffer layer 202 may be formed by performing a buffer ion implantation process on the initial semiconductor layer from the first face. The collector electrode layer 201 may be formed by performing a collector ion implantation process on the initial semiconductor layer from the second face.

The buffer layer 202 may have buffer ions. A conductivity type of the buffer ion may be the same as a conductivity type of the bulk ion, and a concentration of the buffer ions in the buffer layer may be larger than a concentration of the bulk ions in the initial semiconductor layer.

The collector electrode layer 201 may have collector ions. A conductivity type of the collector ion may be opposite to the conductivity type of the buffer ion, and a concentration of the collector ions in the collector electrode layer may be larger than the concentration of the buffer ions in the buffer layer.

The semiconductor layer may include the cell region I and the edge region around the cell region I. The cell region I may include the first region and the second region around the first region. The second region may be formed between the first region and the edge region.

In one embodiment, the edge region may include a transition region II and a terminal protection region III adjacent to the transition region II. The transition region II may be located between the cell region I and the terminal protection region III.

In one embodiment, the semiconductor layer may include a ballast structure formed in the bulk layer 203 in the transition region II, and a protection structure formed in the bulk layer 203 in the terminal protection region III.

Figure 3:
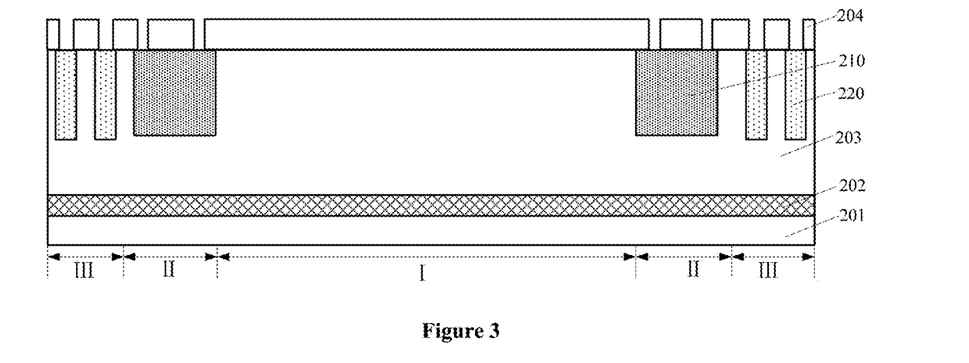

Returning to FIG. 8, after providing the semiconductor layer, a ballast structure and a protection structure may be formed (S102). FIG. 3 illustrates a corresponding semiconductor structure.

Referring to FIG. 3, a ballast structure 210 may be formed in the bulk layer 203 in the transition region II, and a protection structure 220 may be formed in the bulk layer 203 in the terminal protection region III.

The ballast structure 210 may have ballast ions, and the protection structure 220 may have protection ions. A conductivity type of the ballast ion may be opposite to the conductivity type of the bulk ion, and a conductivity type of the protection ion may be opposite to the conductivity type of the bulk ion.

A concentration of the ballast ions in the ballast structure 210 may be smaller than a concentration of well ions in the subsequently formed well region. A concentration of the protection ions in the protection structure 220 may be smaller than the concentration of the well ions in the subsequently formed well region.

When turning off the insulated gate bipolar transistor, during the process where the hole current from the collector electrode layer 201 in the edge region to the bulk layer 203 in the edge region continues to flow through the cell region I, the ballast structure 210 may slow down the current impact on devices in the cell region I. A subsequently formed conductive plug may include a plurality of first conductive plugs and a plurality of second conductive plugs. The first conductive plugs may be connected to the ohmic contact region, and the second conductive plugs may be connected to the ballast structure 210. The first conductive plugs may be electrically connected to portions of the second conductive plugs. A small portion of the hole current from the collector electrode layer 201 in the edge region to the bulk layer 203 in the edge region may be released from the second conductive plugs electrically connected to the first conductive plugs.

When turning off the insulated gate bipolar transistor, during the process where the hole current from the collector electrode layer 201 in the edge region to the bulk layer 203 in the edge region continues to flow through the cell region I, the protection structure 220 may slow down the current impact on devices in the cell region I.

A method for forming the ballast structure 210 and the protection structure 220 may include forming an isolation layer 204 on the bulk layer 203. The isolation layer 204 may cover the bulk layer 203 in the cell region I, and may expose portions of the bulk layer 203 in the transition region II and portions of the bulk layer 203 in the terminal protection region III. The method may also include doping the bulk layer 203 in the transition region II with the ballast ions by using the isolation layer 204 as a mask. In addition, the method may include doping the bulk layer 203 in the terminal protection region III with the protection ions by using the isolation layer 204 as a mask. Further, the method may include performing an annealing process to form the ballast structure 210 in the bulk layer 203 in the transition region II and to from the protection structure 220 in the bulk layer 203 in the terminal protection region III.

In one embodiment, the bulk layer 203 in the terminal protection region III may be doped with the protection ions by using the isolation layer 204 as a mask while doping the bulk layer 203 in the transition region II with the ballast ions by using the isolation layer 204 as a mask. Thus, the process may be simplified.

The isolation layer 204 may be made of silicon oxide. A method for forming the isolation layer 204 may include forming an isolation material layer on the bulk layer 203, and patterning the isolation material layer to form the isolation layer 204.

Then, a well region, a drift region, and a plurality of gate structures may be formed in the bulk layer 203 in the cell region I. The drift region may be formed between the well region and the collector electrode layer 201. A conductivity type of the drift region may be respectively opposite to conductivity types of the well region and the collector electrode layer 201. Each gate structure may penetrate through the well region and may extend into the drift region. In one embodiment, the well region is formed after forming the gate structures as an example. In another embodiment, the gate structures may be formed after forming the well region.

Figure 4:
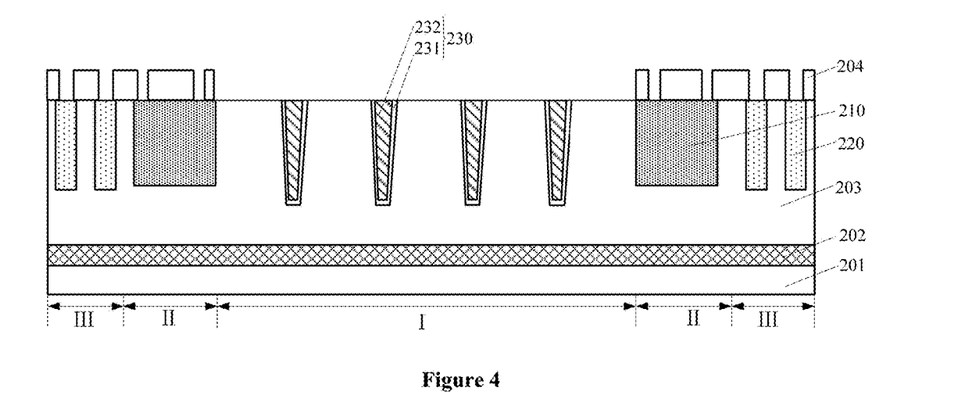

Returning to FIG. 8, after forming the ballast structure and the protection structure, a plurality of gate structures may be formed (S103). FIG. 4 illustrates a corresponding semiconductor structure.

Referring to FIG. 4, a plurality of gate structures 230 may be formed in the bulk layer 203 in the cell region I. In one embodiment, a plurality of trenches (not illustrated) may be formed in the bulk layer 203 in the cell region I. One gate structure 230 may be formed in one trench. Each gate structure 230 may include a gate dielectric layer 231 on the bottom and sidewall surfaces of each trench and a gate electrode layer 232 on the gate dielectric layer 231. The gate dielectric layer 231 may be made of silicon oxide. The gate electrode layer 232 may be made of polysilicon.

A method for forming the gate structure 230 in the trench may include: forming a gate dielectric material layer in the trench and on the bulk layer; forming a gate electrode material layer on the gate dielectric material layer and completely filling the trench; and removing the gate dielectric material layer and the gate electrode material layer on the bulk layer to form the gate structure 230 in the trench. The gate dielectric layer 231 may correspond to the gate dielectric material layer, and the gate electrode layer 232 may correspond to the gate electrode material layer.

Figure 5:
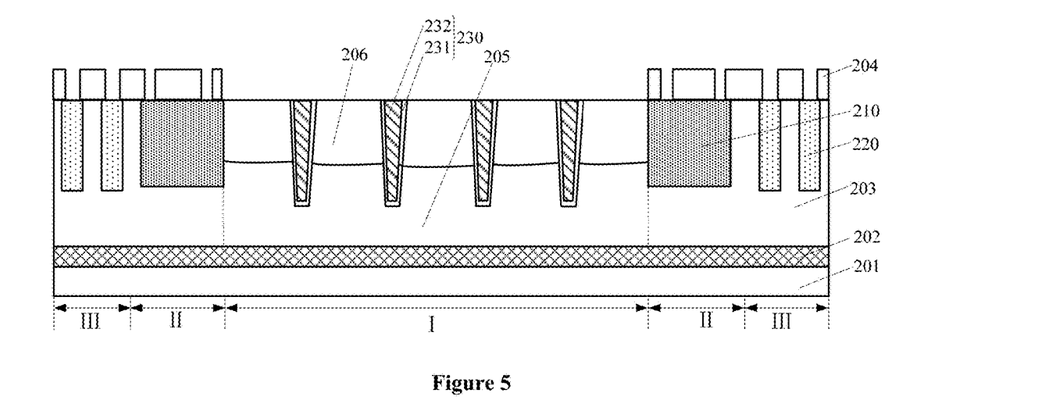

Returning to FIG. 8, after forming the plurality of gate structures, a drift region and a well region may be formed (S104). FIG. 5 illustrates a corresponding semiconductor structure.

Referring to FIG. 5, a drift region 205 and a well region 206 may be formed in the bulk layer 203 in the cell region I. The drift region 205 may be formed between the well region 206 and the collector electrode layer 201. A conductivity type of the drift region 205 may be respectively opposite to conductivity types of the well region 206 and the collector electrode layer 201. Each gate structure 230 may penetrate through the well region 206 and may extend into the drift region 205.

The conductivity type of the drift region 205 may be respectively opposite to the conductivity types of the well region 206 and the collector electrode layer 201. For example, a conductivity type of a semiconductor material of the drift region 205 may be opposite to a conductivity type of a semiconductor material of the well region 206. The conductivity type of the semiconductor material of the drift region 205 may be opposite to a conductivity type of a semiconductor material of the collector electrode layer 201.

In one embodiment, the conductivity type of the semiconductor material of the well region 206 is P-type, and the conductivity type of the semiconductor material of the drift region 205 is N-type as an example. In another embodiment, the conductivity type of the semiconductor material of the well region may be N-type, and the conductivity type of the semiconductor material of the drift region may be P-type.

In one embodiment, a method for forming the drift region 205 and the well region 206 may include: performing a well ion implantation process on the bulk layer 203 in the cell region I on sides of the gate structure to form the well region 206 in the bulk layer 203 in the cell region I on sides of the gate structure; and at the same time, forming the drift region 205 in the bulk layer 203 in the cell region I between the gate structure 230 and the collector electrode layer 201 as well as between the well region 206 on the sides of the gate structure 230 and the collector electrode layer 201.

The well region 206 may have well ions. The drift region 205 may have drift ions. In one embodiment, the bulk ions in the bulk layer 203 in the cell region I between the gate structure 230 and the collector electrode layer 201 as well as between the well region 206 on sides of the gate structure 230 and the collector electrode layer 201 may be referred to the drift ions. A conductivity type of the drift ion may be respectively opposite to conductivity types of the well ion and the collector ion. A concentration of the drift ions in the drift region may be smaller than the concentration of the buffered ions in the buffer layer.

In another embodiment, when the gate structures are formed after forming the well region, a method for forming the gate structures, the well region, and the drift region may include forming the well region and the drift region in a top region of the bulk layer in the cell region I. The drift region may be formed between the well region and the collector electrode layer. The method may also include forming a plurality of gate structures in the bulk layer in the cell region I. Each gate structure may penetrate through the well region and may extend into the drift region.

Each gate structure 230 may penetrate through the well region 206 and may extend into portions of a thickness of the drift region 205. The thickness of the drift region 205 may be referred to a size of the drift region 205 in the direction from the well region 206 to the drift region 205.

Returning to FIG. 8, after forming the drift region and the well region, source and drain doped regions and an ohmic contact region may be formed (S105). FIG. 6 illustrates a corresponding semiconductor structure.

Referring to FIG. 6, source and drain doped regions 240 and an ohmic contact region 241 may be formed in the top region of the well region 206. The source and drain doped regions 240 may be formed on both sides of each gate structure 230 and between the gate structure 230 and the ohmic contact region 241. A conductivity type of the source and drain doped regions 240 may be opposite to the conductivity type of the well region 206. A size of the source and drain doped regions 240 in the second region may be smaller than a size of the source and drain doped regions 240 in the first region. A conductivity type of the ohmic contact region 241 may be the same as the conductivity type of the well region 206. A size of the ohmic contact region 241 in the second region may be larger than a size of the ohmic contact region 241 in the first region.

In one embodiment, a conductivity type of a semiconductor material of the source and drain doped regions 240 may be opposite to the conductivity type of the semiconductor material of the well region 206. A conductivity type of a semiconductor material of the ohmic contact region 241 may be the same as the conductivity type of the semiconductor material of the well region 206.

The source and drain doped regions 240 may be formed in the top region of the well region 206 on both sides of each gate structure 230. In other words, the source and drain doped regions 240 may be formed in the well region 206 on both sides of each gate structure 230. The well region 206 may be formed between the source and drain doped regions 240 and the drift region 205. The top surface of the source and drain doped regions 240 may be portions of the top surface of the well region 206.

In one embodiment, along a direction from the cell region I to the edge region, the size of the source and drain doped regions 240 in the second region may be smaller than the size of the source and drain doped regions 240 in the first region. The size of the ohmic contact region 241 in the second region may be larger than the size of the ohmic contact region 241 in the first region.

In one embodiment, the ohmic contact region 241 may be formed after forming the source and drain doped regions 240. In another embodiment, the source and drain doped regions may be formed after forming the ohmic contact region.

A method for forming the source and drain doped regions 240 may include forming a patterned first mask layer (not illustrated) on the semiconductor layer. The first mask layer may cover the edge region and may expose portions of the well region 206 on both sides of each gate structure 230. The method may also include performing a first ion implantation process on the top region of the well region 206 by using the first mask layer as a mask to form the source and drain doped regions 240. Further, the method may include removing the first mask layer after performing the first ion implantation process.

The source and drain doped regions 240 may have source and drain doped ions.

A conductivity type of the source and drain doped ion may be opposite to the conductivity type of the well ion. A concentration of the source and drain doped ions in the source and drain doped regions may be in a range of approximately $5.0 \times 10^{19}$ atoms/cm$^3$-$5.0 \times 10^{20}$ atoms/cm$^3$.

The conductivity type of the source and drain doped regions 240 may be N-type. In one embodiment, parameters of the first ion implantation process may include the following. Used ions may be phosphorus ions, implantation energy may be in a range of approximately 30 keV-60 keV, an implantation dose may be in a range of approximately $5.0\times10^{14}$ atoms/cm$^3$-$5.0\times10^{15}$ atoms/cm$^3$, and an implantation angle may be in a range of approximately 0 degree-7 degree. In another embodiment, the parameters of the first ion implantation process may include the following. The used ions may be arsenic ions, the implantation energy may be in a range of approximately 40 keV-80 keV, the implantation dose may be in a range of approximately $5.0\times10^{14}$ atoms/cm$^3$-$5.0\times10^{15}$ atoms/cm$^3$, and the implantation angle may be in a range of approximately 0 degree-7 degree.

A method for forming the ohmic contact region 241 may include forming a patterned second mask layer (not illustrated) on the semiconductor layer. The second mask layer may cover the edge region and may expose portions of the well region 260 on both sides of each gate structure 230. The method may also include performing a second ion implantation process on the top region of the well region 206 by using the second mask layer as a mask to form the ohmic contact region 241. Further, the method may include removing the second mask layer after performing the second ion implantation process.

In one embodiment, the ohmic contact region 241 may have ohmic contact ions.

A conductivity type of the ohmic contact ion may be the same as the conductivity type of the well ion. A concentration of the ohmic contact ions in the ohmic contact region may be in a range of approximately $5.0\times10^{19}$ atoms/cm$^3$-$5.0\times10^{20}$ atoms/cm$^3$. The ohmic contact region 241 may reduce a contact barrier between the well region 206 and a subsequently formed first conductive plug.

The conductivity type of the ohmic contact region 241 may be P-type. In one embodiment, parameters of the second ion implantation process may include the following. Used ions may be boron ions, implantation energy may be in a range of approximately 20 keV-40 keV, an implantation dose may be in a range of approximately $5.0\times10^{14}$ atoms/cm$^3$-$5.0\times10^{15}$ atoms/cm$^3$, and an implantation angle may be in a range of approximately 0 degree-7 degree. In another embodiment, the parameters of the second ion implantation process may include the following. The used ions may be boron fluoride ions, the implantation energy may be in a range of approximately 25 keV-50 keV, the implantation dose may be in a range of approximately $5.0\times10^{14}$ atoms/cm$^3$-$5.0\times10^{15}$ atoms/cm$^3$, and the implantation angle may be in a range of approximately 0 degree-7 degree.

The concentration of the ohmic contact ions in the ohmic contact region 241 may be larger than the concentration of the well ions in the well region 206. The conductivity type of the ohmic contact region 241 may be the same as the conductivity type of the well region 206. A channel region may be formed in the well region 206 near each gate structure 230. The size of the source and drain doped regions 240 in the second region may be smaller than the size of the source drain doped regions 240 in the first region, and the size of the ohmic contact region 241 in the second region may be larger than the size of the ohmic contact region 241 in the first region. The ohmic contact ions may be likely to enter the channel region in the second region during the annealing process for forming the ohmic contact region 241 and the source and drain doped regions 240. The ohmic contact ions entering the channel region and the well ions in the channel region may together determine a threshold voltage of each gate structure 230. Correspondingly, the threshold voltage of each gate structure 230 in the second region may be larger than the threshold voltage of each gate structure 230 in the first region.

The source and drain doped regions 240, the well region 206 between the source and drain doped regions 240 and the drift region 205, and the drift region 205 may form a triode. The well region 206 between the source and drain doped regions 240 and the drift region 205 may serves as a base of the triode. Along a direction from the cell region I to the edge region, the size of the source and drain doped regions 240 in the second region may be smaller than the size of the source and drain doped regions 240 in the first region, and the size of the ohmic contact region 241 in the second region may be larger than the size of the ohmic contact region 241 in the first region. Therefore, a resistance of the well region 206 between the source and drain doped regions 240 and the drift region 205 in the second region as the base of the triode may be small.

For example, on the one hand, along the direction from the cell region I to the edge region, the size of the source and drain doped regions 240 in the second region may be smaller than the size of the source and drain doped regions 240 in the first region. Therefore, a resistance length of the well region 206 between the source and drain doped regions 240 and the drift region 205 as the base of the triode may be reduced. On the other hand, along the direction from the cell region I to the edge region, the size of the ohmic contact region 241 in the second region may be larger than the size of the ohmic contact region 241 in the first region. Thus, the ohmic contact region 241 in the second region may be closer to each gate structure 230 compared to the ohmic contact region 241 in the first region. During the annealing process for forming the ohmic contact region 241, the extent to which the ohmic contact ions in the second region diffuse into the well region 206 between the source and drain doped regions 240 and the drift region 205 may be larger than the extent to which the ohmic contact ions in the first region diffuse into the well region 206 between the source and drain doped regions 240 and the drift region 205. The well ions and the ohmic contact ions in the well region 206 may jointly affect the resistance of the base of the triode. Accordingly, the resistance of the well region 206 below the source and drain doped regions 240 in the second region as the base of the triode may be small.

The resistance of the well region 206 below the source and drain doped regions 240 in the second region as the base of the triode may be small. When turning off the insulated gate bipolar transistor, the hole current flowing from the collector electrode layer 201 to the drift region 205 and the well region 206 may be less likely to open the PN junction between the source and drain doped regions 240 in the second region and the well region 206 in the second region as the base of the triode. Thereby, the ability of the anti-latching effect of the insulated gate bipolar transistor in the second region may be enhanced, and the reverse turn off safe operating area of the insulated gate bipolar transistor may increase.

Because the size of the source and drain doped regions 240 in the second region is smaller than the size of the source and drain doped regions 240 in the first region, the threshold voltage corresponding to each gate structure 230 in the first region may be smaller than the threshold voltage corresponding to each gate structure 230 in the second region. The number of the gate structures 230 in the first region may occupy most of the total number of the gate structures 230 in the cell region I, and the number of the gate structures 230 in the second region may be small. In the case where the size of the source and drain doped regions 240 in the first region is kept constant, the overall threshold voltage of the insulated gate bipolar transistor may not be changed, and the stability of the performance of the insulated gate bipolar transistor may be improved. In one embodiment, the number of the gate structures 230 in the first region may occupy 95%-98% of the total number of the gate structures 230 in the cell region I.

In one embodiment, along the direction from the cell region I to the edge region, the size of the source and drain doped regions 240 between the adjacent gate structures 230 in the second region may be the same, and the size of the source and drain doped regions 240 on one side of the gate structure 230 in the second region may be progressively reduced compared to the size of the source and drain doped regions 240 on the other side of the gate structure 230 in the second region. Along the direction from the cell region I to the edge region, the size of the ohmic contact region 241 in the second region may progressively increase. Further, in this case, the threshold voltage of the gate structure 230 in the second region may progressively decrease along the direction from the edge region to the cell region I. Therefore, when turning off the insulated gate bipolar transistor, the gate structures 230 in the second region may be sequentially turned off along the direction from the edge region to the cell region I, and the time of the anti-latching effect of the insulated gate bipolar transistor in the second region may be extended.

Along the direction from the cell region I to the edge region, the size of the source and drain doped regions 240 between the adjacent gate structures 230 in the second region may be the same, and the reduced size of the source and drain doped regions 240 on one side of the gate structure 230 in the second region compared to the source and drain doped regions 240 on the other side of the gate structure 230 in the second region may be the same. Along the direction from the cell region I to the edge region, the increased size of the adjacent ohmic contact regions 241 in the second region may be the same.

The source and drain doped regions 240 in the second region may have a first maximum size. The ohmic contact region 241 in the second region may have a second maximum size. The first maximum size may be referred to the size corresponding to the largest source and drain doped regions 240 among all the source and drain doped regions 240 in the second region. The second maximum size may be referred to the size corresponding to the largest ohmic contact region 241 among all the ohmic contact regions 241 in the second region.

Along the direction from the cell region I to the edge region, the size of the source and drain doped regions 240 between the adjacent gate structures 230 in the second region may be the same, and the reduced size of the source and drain doped regions 240 on one side of the gate structure 230 in the second region compared to the source and drain doped regions 240 on the other side of the gate structure 230 in the second region may be in a range of approximately $1/3$-$1/5$ of the first maximum size. Along the direction from the cell region I to the edge region, the increased size of the adjacent ohmic contact regions 241 in the second region may be in a range of approximately $1/3$-$1/5$ of the second maximum size.

In another embodiment, along the direction from the cell region I to the edge region, the size of the source and drain doped regions 240 in the second region may progressively decrease, and the size of the ohmic contact region 241 in the second region may progressively increase.

Returning to FIG. 8, after forming the source and drain doped regions and the ohmic contact region, an interlayer dielectric layer and conductive plugs may be formed (S106). FIG. 7 illustrates a corresponding semiconductor structure.

Referring to FIG. 7, after forming the source and drain doped regions 240 and the ohmic contact region 241, an interlayer dielectric layer 250 may be formed on the isolation layer 204 and the bulk layer 203, and conductive plugs 260 may be formed in the interlayer dielectric layer 250.

The interlayer dielectric layer 250 may be made of silicon oxide, silicon oxynitride, or silicon oxycarbide, etc. The conductive plugs 260 may be made of a metal, such as copper, tungsten, or aluminum, etc.

The conductive plugs 260 may include first conductive plugs, second conductive plugs and third conductive plugs. Each first conductive plug may be electrically connected to the ohmic contact region 241, each second conductive plug may be electrically connected to the ballast structure 210, and each third conductive plug may be electrically connected to the protection structure 220.

A process for forming the interlayer dielectric layer 250 may include a deposition process, such as a plasma chemical vapor deposition process, a sub-atmospheric chemical vapor deposition process, or a low-pressure chemical vapor deposition process, etc.

A method for forming the first conductive plugs, the second conductive plugs, and the third conductive plugs in the interlayer dielectric layer 250 may include forming first through holes, second through holes and third through holes in the interlayer dielectric layer 250. Each first through hole may expose the ohmic contact region 241, each second through hole may expose the ballast structure 210, and each third through hole may expose the protection structure 220. The method may also include forming one first conductive plug in one first through hole, forming one second conductive plug in one second through hole, and forming one third conductive plug in one third through hole.

Correspondingly, an insulated gate bipolar transistor is provided in the present disclosure. FIG. 7 illustrates an insulated gate bipolar transistor consistent with disclosed embodiments.

Referring to FIG. 7, the insulated gate bipolar transistor may include a semiconductor layer. The semiconductor layer may include a collector electrode layer 201 and a bulk layer 203 on the collector electrode layer 201. The semiconductor layer may have a cell region I and an edge region around the cell region I. The cell region I may include a first region and a second region around the first region. The insulated gate bipolar transistor may also include a well region 206 in the bulk layer 203 in the cell region I, and a drift region 205 in the bulk layer 203 in the cell region I. The drift region 205 may be formed between the well region 206 and the collector electrode layer 201. A conductivity type of the drift region 205 may be respectively opposite to conductivity types of the well region 206 and the collector electrode layer 201. In addition, the insulated gate bipolar transistor may include a plurality of gate structures 230 in the bulk layer 203 in the cell region I. Each gate structure 230 may penetrate through the well region 206 and may extend into the drift region 205. Moreover, the insulated gate bipolar transistor may include source and drain doped regions 240 in a top region of the well region 206 on both sides of each gate structure 230. A conductivity type of the source and drain doped regions 240 may be opposite to the conductivity type of the well region 206. A size of the source and drain doped regions 240 in the second region may be smaller than a size of the source and drain doped regions 240 in the first region. Further, the insulated gate bipolar transistor may include an ohmic contact region 241 in the top region of the well region 206. The source and drain doped regions 240 may be formed between the gate structure 230 and the ohmic contact region 241. A conductivity type of the ohmic contact region 241 may be the same as the conductivity type of the well region 206. A size of the ohmic contact region 241 in the second region may be larger than a size of the ohmic contact region 241 in the first region.

In one embodiment, the semiconductor layer may also include a buffer layer 202. The buffer layer 202 may be formed between the collector electrode layer 201 and the bulk layer 203. The conductivity type of the collector electrode layer 201 may be opposite to a conductivity type of the buffer layer 202. The buffer layer 202 may have buffer ions. The drift region 205 may have drift ions. A concentration of the buffer ions in the buffer layer 202 may be larger than a concentration of the drift ions in the drift region 205.

The semiconductor layer may include the cell region I and the edge region around the cell region I. The cell region I may include the first region and the second region around the first region. The second region may be located between the first region and the edge region.

The edge region may include a transition region II and a terminal protection region III adjacent to the transition region II. The transition region II may be located between the cell region I and the terminal protection region III.

In one embodiment, the insulated gate bipolar transistor may include a ballast structure 210 in the bulk layer 203 in the transition region II, and a protection structure 220 in the bulk layer 203 in the terminal protection region III. The ballast structure 210 may have ballast ions, and the protection structure 220 may have protection ions. A conductivity type of the ballast ion may be opposite to the conductivity type of the bulk ion, and a conductivity type of the protection ion may be opposite to the conductivity type of the bulk ion.

The well region 206 may have well ions. A concentration of the ballast ions in the ballast structure 210 may be smaller than a concentration of the well ions in the well region 206. The collector electrode layer 201 may have collector ions. A conductivity type of the collector ion may be opposite to the conductivity type of the buffer ion, and a concentration of the collector ions in the collector electrode layer may be larger than the concentration of the buffer ions in the buffer layer. The drift region 205 may have drift ions. A conductivity type of the drift ion may be respectively opposite to the conductivity types of the well ion and the collector ion. A concentration of the drift ions in the drift region may be smaller than the concentration of the buffer ions in the buffer layer. The ohmic contact region may have ohmic contact ions. A concentration of the ohmic contact ions in the ohmic contact region 241 may be larger than the concentration of the well ions in the well region 206. A concentration of the ohmic contact ions in the ohmic contact region may be in a range of approximately $5.0 \times 10^{19}$ atoms/cm$^3$-$5.0 \times 10^{20}$ atoms/cm$^3$. The source and drain doped regions 240 may have source and drain doped ions. A concentration of the source and drain doped ions in the source and drain doped regions 240 may be in a range of approximately $5.0 \times 10^{19}$ atoms/cm$^3$-$5.0 \times 10^{20}$ atoms/cm$^3$.

In the insulated gate bipolar transistor in the present disclosure, the source and drain doped regions 240, the well region 206 between the source and drain doped regions 240 and the drift region 205, and the drift region 205 may form a triode. The well region 206 between the source and drain doped regions 240 and the drift region 205 may serves as a base of the triode. Along a direction from the cell region I to the edge region, the size of the source and drain doped regions 240 in the second region may be smaller than the size of the source and drain doped regions 240 in the first region, and the size of the ohmic contact region 241 in the second region may be larger than the size of the ohmic contact region 241 in the first region. Therefore, a resistance of the well region 206 between the source and drain doped regions 240 and the drift region 205 in the second region as the base of the triode may be small. When turning off the insulated gate bipolar transistor, the hole current flowing from the collector electrode layer 201 to the drift region 205 and the well region 206 may be less likely to open the PN junction between the source and drain doped regions 240 in the second region and the well region 206 in the second region as the base of the triode. Thereby, the ability of the anti-latching effect of the insulated gate bipolar transistor in the second region may be enhanced, and the reverse turn off safe operating area of the insulated gate bipolar transistor may increase.

Because the size of the source and drain doped regions 240 in the second region is smaller than the size of the source and drain doped regions 240 in the first region, a threshold voltage corresponding to each gate structure 230 in the first region may be smaller than a threshold voltage corresponding to each gate structure 230 in the second region. The number of the gate structures 230 in the first region may occupy most of the total number of the gate structures 230 in the cell region I, and the number of the gate structures 230 in the second region may be small. In the case where the size of the source and drain doped regions 240 in the first region is kept constant, the overall threshold voltage of the insulated gate bipolar transistor may not be changed, and the stability of the performance of the insulated gate bipolar transistor may be improved. In one embodiment, the number of the gate structures 230 in the first region may occupy 95%-98% of the total number of the gate structures 230 in the cell region I.

In one embodiment, along the direction from the cell region I to the edge region, the size of the source and drain doped regions 240 between the adjacent gate structures 230 in the second region may be the same, and the size of the source and drain doped regions 240 on one side of the gate structure 230 in the second region may be progressively reduced compared to the size of the source and drain doped regions 240 on the other side of the gate structure 230 in the second region. Along the direction from the cell region I to the edge region, the size of the ohmic contact region 241 in the second region may progressively increase. Further, in this case, the threshold voltage of the gate structure 230 in the second region may progressively decrease along the direction from the edge region to the cell region I. Therefore, when turning off the insulated gate bipolar transistor, the gate structures 230 in the second region may be sequentially turned off along the direction from the edge region to the cell region I, and the time of the anti-latching effect of the insulated gate bipolar transistor in the second region may be extended.

Along the direction from the cell region I to the edge region, the size of the source and drain doped regions 240 between the adjacent gate structures 230 in the second region may be the same, and the reduced size of the source and drain doped regions 240 on one side of the gate structure 230 in the second region compared to the source and drain doped regions 240 on the other side of the gate structure 230 in the second region may be the same. Along the direction from the cell region I to the edge region, the increased size of the adjacent ohmic contact regions 241 in the second region may be the same.

The source and drain doped regions 240 in the second region may have a first maximum size. The ohmic contact region 241 in the second region may have a second maximum size. Along the direction from the cell region I to the edge region, the size of the source and drain doped regions 240 between the adjacent gate structures 230 in the second region may be the same, and the reduced size of the source and drain doped regions 240 on one side of the gate structure 230 in the second region compared to the source and drain doped regions 240 on the other side of the gate structure 230 in the second region may be in a range of approximately ⅓-⅕ of the first maximum size. Along the direction from the cell region I to the edge region, the increased size of the adjacent ohmic contact regions 241 in the second region may be in a range of approximately ⅓-⅕ of the second maximum size.

In another embodiment, along the direction from the cell region I to the edge region, the size of the source and drain doped regions 240 in the second region may progressively decrease, and the size of the ohmic contact region 241 in the second region may progressively increase.

In the insulated gate bipolar transistor in the present disclosure, the source and drain doped regions, the well region between the source and drain doped regions and the drift region, and the drift region may form a triode. The well region between the source and drain doped regions and the drift region may serves as a base of the triode. Since the size of the source and drain doped regions in the second region is smaller than the size of the source and drain doped regions in the first region, and the size of the ohmic contact region in the second region is larger than the size of the ohmic contact region in the first region, a resistance of the well region between the source and drain doped regions and the drift region in the second region as the base of the triode may be small. When turning off the insulated gate bipolar transistor, the hole current flowing from the collector electrode layer to the drift region and the well region may be less likely to open the PN junction between the source and drain doped regions in the second region and the well region in the second region as the base of the triode. Thereby, the ability of the anti-latching effect of the insulated gate bipolar transistor in the second region may be enhanced, and the reverse turn off safe operating area of the insulated gate bipolar transistor may increase. Since the size of the source and drain doped regions in the second region is smaller than the size of the source and drain doped regions in the first region, the threshold voltage corresponding to each gate structure in the first region may be smaller than the threshold voltage corresponding to each gate structure in the second region. The number of the gate structures in the first region may occupy most of the total number of the gate structures in the cell region, and the number of the gate structures in the second region may be small. In the case where the size of the source and drain doped regions in the first region is kept constant, the overall threshold voltage of the insulated gate bipolar transistor may not be changed, and the stability of the performance of the insulated gate bipolar transistor may be improved. Therefore, the electrical performance of the insulated gate bipolar transistor may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those skilled in the art. Any equivalent or modification thereof, without departing from the spirit and principle of the present disclosure, falls within the true scope of the present disclosure.

What is claimed is:

1. An insulated gate bipolar transistor, comprising:
    a semiconductor layer, including a collector electrode layer and a bulk layer on the collector electrode layer, wherein the semiconductor layer has a cell region and an edge region around the cell region, and the cell region includes a first region and a second region around the first region;
    a well region, in the bulk layer associated with the cell region;
    a drift region, in the bulk layer associated with the cell region, wherein the drift region is formed between the well region and the collector electrode layer, and a conductivity type of the drift region is respectively opposite to conductivity types of the well region and the collector electrode layer;
    a plurality of gate structures, in the bulk layer associated with the cell region, wherein each gate structure penetrates through the well region and extends into the drift region;
    source and drain doped regions, in a top region of the well region on both sides of each gate structure, wherein a conductivity type of the source and drain doped regions is opposite to the conductivity type of the well region, and a size of the source and drain doped regions in the second region is smaller than a size of the source and drain doped regions in the first region; and
    an ohmic contact region, in the top region of the well region, wherein the source and drain doped regions are formed between each gate structure and the ohmic contact region, a conductivity type of the ohmic contact region is the same as the conductivity type of the well region, and a size of the ohmic contact region in the second region is larger than a size of the ohmic contact region in the first region.

2. The insulated gate bipolar transistor according to claim 1, wherein:
    the size of the source and drain doped regions between the adjacent gate structures in the second region is the same along a direction from the cell region to the edge region;
    the size of the source and drain doped regions on one side of the gate structure in the second region is reduced compared to the size of the source and drain doped regions on the other side of the gate structure in the second region along the direction from the cell region to the edge region; and
    the size of the ohmic contact region in the second region progressively increases along the direction from the cell region to the edge region.

3. The insulated gate bipolar transistor according to claim 2, wherein:
    the size of the source and drain doped regions between the adjacent gate structures in the second region is the same along the direction from the cell region to the edge region;
    the reduced size of the source and drain doped regions on one side of the gate structure in the second region compared to the source and drain doped regions on the other side of the gate structure in the second region is the same along the direction from the cell region to the edge region; and the increased size of the adjacent ohmic contact regions in the second region is the same along the direction from the cell region to the edge region.

4. The insulated gate bipolar transistor according to claim 3, wherein:
the source and drain doped regions in the second region have a first maximum size;
the ohmic contact region in the second region has a second maximum size;
the size of the source and drain doped regions between the adjacent gate structures in the second region is the same along the direction from the cell region to the edge region;
the reduced size of the source and drain doped regions on one side of the gate structure in the second region compared to the source and drain doped regions on the other side of the gate structure in the second region is in a range of approximately ⅓-⅕ of the first maximum size along the direction from the cell region to the edge region; and
the increased size of the adjacent ohmic contact regions in the second region is in a range of approximately ⅓-⅕ of the second maximum size along the direction from the cell region to the edge region.

5. The insulated gate bipolar transistor according to claim 1, wherein:
the semiconductor layer includes a buffer layer formed between the collector electrode layer and the bulk layer; and
a conductivity type of the buffer layer is the same as the conductivity type of the drift region.

6. The insulated gate bipolar transistor according to claim 5, wherein:
the buffer layer has buffer ions;
the drift region has drift ions; and
a concentration of the buffer ions in the buffer layer is larger than a concentration of the drift ions in the drift region.

7. The insulated gate bipolar transistor according to claim 1, wherein:
the ohmic contact region has ohmic contact ions;
the well region has well ions; and
a concentration of the ohmic contact ions in the ohmic contact region is larger than a concentration of the well ions in the well region.

8. The insulated gate bipolar transistor according to claim 1, wherein:
the edge region includes a transition region and a terminal protection region adjacent to the transition region; and
the transition region is located between the cell region and the terminal protection region, wherein the insulated gate bipolar transistor includes:
a ballast structure in the bulk layer in the transition region, and
a protection structure in the bulk layer in the terminal protection region.

9. An insulated gate bipolar transistor, comprising:
a semiconductor layer, including a collector electrode layer and a bulk layer on the collector electrode layer, wherein the semiconductor layer has a cell region and an edge region around the cell region, and the cell region includes a first region and a second region around the first region;
a well region, in the bulk layer associated with the cell region;
a drift region, in the bulk layer associated with the cell region, wherein the drift region is formed between the well region and the collector electrode layer, and a conductivity type of the drift region is respectively opposite to conductivity types of the well region and the collector electrode layer;
a plurality of gate structures, in the bulk layer associated with the cell region, wherein each gate structure penetrates through the well region and extends into the drift region;
source and drain doped regions, in a top region of the well region on both sides of each gate structure, wherein a conductivity type of the source and drain doped regions is opposite to the conductivity type of the well region, and a size of the source and drain doped regions in the second region is smaller than a size of the source and drain doped regions in the first region; and
an ohmic contact region, in the top region of the well region, wherein the source and drain doped regions are formed between each gate structure and the ohmic contact region, a conductivity type of the ohmic contact region is the same as the conductivity type of the well region, and a size of the ohmic contact region in the second region is larger than a size of the ohmic contact region in the first region, wherein:
the size of the source and drain doped regions in the second region progressively decreases along a direction from the cell region to the edge region; and
the size of the ohmic contact region in the second region progressively increases along the direction from the cell region to the edge region.

10. A method for fabricating an insulated gate bipolar transistor, comprising:
providing a semiconductor layer, including a collector electrode layer and a bulk layer on the collector electrode layer, wherein the semiconductor layer has a cell region and an edge region around the cell region, and the cell region includes a first region and a second region around the first region;
forming a well region, a drift region, and a plurality of gate structures, in the bulk layer associated with the cell region, wherein the drift region is formed between the well region and the collector electrode layer, a conductivity type of the drift region is respectively opposite to conductivity types of the well region and the collector electrode layer, and each gate structure penetrates through the well region and extends into the drift region; and
forming source and drain doped regions and an ohmic contact region, in a top region of the well region, wherein the source and drain doped regions are formed on both sides of each gate structure and between the gate structure and the ohmic contact region, a conductivity type of the source and drain doped regions is opposite to the conductivity type of the well region, a size of the source and drain doped regions in the second region is smaller than a size of the source and drain doped regions in the first region, a conductivity type of the ohmic contact region is the same as the conductivity type of the well region, and a size of the ohmic contact region in the second region is larger than a size of the ohmic contact region in the first region.

11. The method according to claim 10, wherein:
the ohmic contact region is formed after forming the source and drain doped regions; or
the source and drain doped regions are formed after forming the ohmic contact region.

12. The method according to claim 11, wherein forming the source and drain doped regions includes:

forming a patterned first mask layer on the semiconductor layer, wherein the first mask layer covers the edge region and exposes portions of the well region on both sides of each gate structure;

performing a first ion implantation process on the top region of the well region by using the first mask layer as a mask to form the source and drain doped regions; and removing the first mask layer after performing the first ion implantation process.

13. The method according to claim 12, wherein forming the ohmic contact region includes:

forming a patterned second mask layer on the semiconductor layer, wherein the second mask layer covers the edge region and exposes portions of the well region on both sides of each gate structure;

performing a second ion implantation process on the top region of the well region by using the second mask layer as a mask to form the ohmic contact region; and removing the second mask layer after performing the second ion implantation process.

14. The method according to claim 10, wherein:

the size of the source and drain doped regions between the adjacent gate structures in the second region is the same along a direction from the cell region to the edge region;

the size of the source and drain doped regions on one side of the gate structure in the second region is reduced compared to the size of the source and drain doped regions on the other side of the gate structure in the second region along the direction from the cell region to the edge region; and the size of the ohmic contact region in the second region progressively increases along the direction from the cell region to the edge region.

15. The method according to claim 14, wherein:

the size of the source and drain doped regions between the adjacent gate structures in the second region is the same along the direction from the cell region to the edge region;

the reduced size of the source and drain doped regions on one side of the gate structure in the second region compared to the source and drain doped regions on the other side of the gate structure in the second region is the same along the direction from the cell region to the edge region; and the increased size of the adjacent ohmic contact regions in the second region is the same along the direction from the cell region to the edge region.

16. The method according to claim 15, wherein:

the source and drain doped regions in the second region have a first maximum size;

the ohmic contact region in the second region has a second maximum size;

the size of the source and drain doped regions between the adjacent gate structures in the second region is the same along the direction from the cell region to the edge region;

the reduced size of the source and drain doped regions on one side of the gate structure in the second region compared to the source and drain doped regions on the other side of the gate structure in the second region is in a range of approximately ⅓-⅕ of the first maximum size along the direction from the cell region to the edge region; and the increased size of the adjacent ohmic contact regions in the second region is in a range of approximately ⅓-⅕ of the second maximum size along the direction from the cell region to the edge region.

17. The method according to claim 10, wherein:

the size of the source and drain doped regions in the second region progressively decreases along a direction from the cell region to the edge region; and the size of the ohmic contact region in the second region progressively increases along the direction from the cell region to the edge region.

18. The method according to claim 10, wherein:

the ohmic contact region has ohmic contact ions;

the well region has well ions; and a concentration of the ohmic contact ions in the ohmic contact region is larger than a concentration of the well ions in the well region.

19. The method according to claim 10, wherein:

the semiconductor layer includes a buffer layer formed between the collector electrode layer and the bulk layer; and a conductivity type of the buffer layer is the same as the conductivity type of the drift region.

20. The method according to claim 10, wherein:

the edge region includes a transition region and a terminal protection region adjacent to the transition region; and the transition region is located between the cell region and the terminal protection region, wherein before forming the gate structures, forming the insulated gate bipolar transistor includes:

forming a ballast structure in the bulk layer in the transition region, and forming a protection structure in the bulk layer in the terminal protection region.

* * * * *